United States Patent [19]

Cereda et al.

[11] Patent Number: 5,696,399
[45] Date of Patent: Dec. 9, 1997

[54] PROCESS FOR MANUFACTURING MOS-TYPE INTEGRATED CIRCUITS

[75] Inventors: Manlio Sergio Cereda, Lomagna; Giancarlo Ginami, Bergamo, both of Italy

[73] Assignee: SGS-Thomson Microelectronics S.r.l., Agrate Brianza, Italy

[21] Appl. No.: 475,555

[22] Filed: Jun. 7, 1995

Related U.S. Application Data

[62] Division of Ser. No. 980,453, Nov. 23, 1992, abandoned.

[30] Foreign Application Priority Data

Nov. 29, 1991 [IT] Italy ............................ TO91A0929

[51] Int. Cl.⁶ .................................................. H01L 29/76
[52] U.S. Cl. ........................ 257/385; 257/71; 257/316; 257/377; 257/382; 257/398; 257/399; 257/412; 257/519
[58] Field of Search ........................... 257/71, 316, 377, 257/382, 385, 398, 399, 412, 519

[56] References Cited

U.S. PATENT DOCUMENTS

| | | | |
|---|---|---|---|
| 3,319,311 | 5/1967 | Mutter | 29/25.3 |
| 3,434,019 | 3/1969 | Carley | 317/235 |
| 3,461,360 | 8/1969 | Barson et al. | 317/235 |

(List continued on next page.)

FOREIGN PATENT DOCUMENTS

| | | | |
|---|---|---|---|
| 1123119 | 5/1982 | Canada | H01L 29/04 |
| 1136291 | 11/1982 | Canada | H01L 29/94 |
| 0206929 | 12/1986 | European Pat. Off. | H01L 21/82 |
| 0428283 | 5/1991 | European Pat. Off. | H01L 21/76 |
| 51-48981 | 4/1976 | Japan | H01L 29/78 |
| 51-85381 | 7/1976 | Japan | H01L 29/78 |
| 53-66181 | 6/1978 | Japan | H01L 39/78 |
| 53-74385 | 7/1978 | Japan | H01L 29/76 |
| 53-135284 | 11/1978 | Japan | H01L 29/78 |
| 020866 | 8/1989 | Japan | |
| 283944 | 11/1989 | Japan | |
| 1372086 | 10/1974 | United Kingdom | H01L 7/34 |

OTHER PUBLICATIONS

Integrated Circuits Laboratory, Stanford Electronics Laboratories, Standford University, Standford, CA. Michael Donald Pocha, Mar. 1976, Technical Report No. 4956–1, pp. 229–240 "High Voltage Double Diffused MOS Transistors for Integrated Circuits".

IEEE Journal of Solid–State Circuits, vol. SC11, No. 4, Aug. 1974, Isao Yoshida, et al., pp. 472–477 "A High Power MISFIT with a Vertical Drain Electrode and a Meshed Gate Structure".

IEEE Journal of Solid–State Circuits, vol. SC–11, No. 5, Oct. 1976, Michael D. Pocha, pp. 718–726 "A Computer–Aided Design Model for High–Voltage Double Diffused MOS (DMOS) Transistors".

Exhibit IV, Laid Open Patent Specification No. 85073/80; Laid Open Date Jun. 26, 1980; Patent Application No. 162677/74 (divided from Pat. Appln. No. 9713/74) Patent Application Date Jan. 24, 1975, Isao Yoshida.

Patent Abstract of Japan, vol. 16, No. 185 (E–1197) May 6, 1992.

Patent Abstract of Japan, vol. 9, No. 35 (E–296) ((1758) Feb. 14, 1985.

(List continued on next page.)

*Primary Examiner*—Edward Wojchiechowicz
*Attorney, Agent, or Firm*—Wolf, Greenfield & Sacks, P.C.; James H. Morris; Randy J. Pritzker

[57] ABSTRACT

A process for producing integrated circuits including the steps of: selectively growing field insulating regions of insulating material extending partly inside a substrate having a given type of conductivity; depositing a polycrystalline silicon layer on the substrate; shaping the polycrystalline silicon layer through a mask; and selectively implanting ions of the same conductivity type as the substrate, using the shaping mask, through the field insulating regions. The implanted ions penetrate the substrate and form channel stopper regions beneath the field insulating regions.

4 Claims, 3 Drawing Sheets

U.S. PATENT DOCUMENTS

| | | | |
|---|---|---|---|
| 3,764,396 | 10/1973 | Tarui et al. | 148/1.5 |
| 3,821,776 | 6/1974 | Havamhi et al. | 357/23 |
| 3,845,495 | 10/1974 | Cauge et al. | 357/23 |
| 3,849,216 | 11/1974 | Herman et al. | 148/187 |
| 3,909,320 | 9/1975 | Gauge et al. | 148/187 |
| 3,924,265 | 12/1975 | Rodgers | 357/44 |
| 3,950,777 | 4/1976 | Tarui et al. | 357/23 |
| 3,986,903 | 10/1976 | Watrous, Jr. | 148/187 |
| 4,001,860 | 1/1977 | Cauge et al. | 357/23 |
| 4,015,278 | 3/1977 | Fukuta | 357/22 |
| 4,055,884 | 11/1977 | Chakrapani | 29/571 |
| 4,072,975 | 2/1978 | Ishitani | 357/23 |
| 4,145,700 | 3/1979 | Jambotkar | 357/23 |
| 4,145,703 | 3/1979 | Blanchard et al. | 357/55 |
| 4,148,047 | 4/1979 | Hendrickson | 357/23 |
| 4,190,850 | 2/1980 | Tihanvi et al. | 357/23 |
| 4,246,593 | 1/1981 | Bartlett | 257/385 |
| 4,344,081 | 8/1982 | Pao et al. | 357/43 |
| 4,376,286 | 3/1983 | Lidow et al. | 357/23 |
| 4,399,449 | 8/1983 | Herman et al. | 357/53 |
| 4,412,242 | 10/1983 | Herman et al. | 357/52 |
| 4,549,193 | 10/1985 | Malhi et al. | 357/22 |
| 4,593,302 | 6/1986 | Lidow et al. | 357/23.4 |
| 4,604,641 | 8/1986 | Konishi | 257/385 |
| 4,663,645 | 5/1987 | Komori et al. | 357/23.5 |
| 4,680,853 | 7/1987 | Lidow et al. | 29/571 |
| 4,719,184 | 1/1988 | Cantarelli et al. | 437/24 |
| 4,786,614 | 11/1988 | Cogan | 437/64 |
| 4,798,810 | 1/1989 | Blanchard et al. | 437/29 |
| 4,918,501 | 4/1990 | Komori et al. | 357/23.5 |
| 4,931,408 | 6/1990 | Hshieh | 437/44 |
| 5,004,701 | 4/1991 | Motokawa | 437/47 |
| 5,098,855 | 3/1992 | Komori et al. | 437/52 |
| 5,153,143 | 10/1992 | Schlais et al. | 437/43 |
| 5,192,707 | 3/1993 | Hodges et al. | 437/70 |
| 5,194,924 | 3/1993 | Komori et al. | 257/316 |
| 5,338,961 | 8/1994 | Lidow et al. | 257/342 |

OTHER PUBLICATIONS

IEDM 1983 Dec. 5–7, 1983, New York pp. 526–529, J.Y.-T.Chen 'AN N–Well CMOS with Self–Aligned Channel Stops'.

IBM TDB, vol. 26, No. 3B, Aug. 1983, pp. 1318–1322, N. Lu 'High–Capacitance Dynamic RAM Cell Using Buried Polysilicon Electrodes and Buried Oxide MOS Transistors'.

European Search Reported issued in EP 92 11 8785.

PROCESS FOR MANUFACTURING MOS-TYPE INTEGRATED CIRCUITS

This application is a division of application Ser. No. 07/980,453 filed Nov. 23, 1992, entitled PROCESS FOR MANUFACTURING MOS-TYPE INTEGRATED CIRCUITS, now abandoned.

BACKGROUND OF THE INVENTION

1. Field of the Invention

The present invention relates to a process for manufacturing MOS-type integrated circuits.

2. Discussion of the Related Art

The need for forming large numbers of electrically connected devices on the same substrate requires that the devices be located physically as close together as possible, while at the same time operating independently in the same way as discrete components.

For this purpose, special prior art insulating techniques have been devised for minimizing the space required for ensuring correct insulation of adjacent devices, enabling a high degree of integration. Reducing the size of each device, in fact, provides for reducing the total area of the integrated circuit, thus enabling a larger number of circuits to be formed on the same wafer, and a substantial reduction in circuit cost.

One such prior art technique widely used for NMOS, PMOS and CMOS circuits is the LOCOS (LOCal Oxidation of Silicon) technique, which includes defining the active areas by depositing a layer of nitride, implanting channel stoppers in predetermined regions of the substrate through a mask, and growing field oxide regions in the portions which are not covered by the nitride layer. The advantages of the LOCOS technique are the following: simplicity; the possibility of implanting channel stoppers automatically aligned with the active regions (as required for micrometric and submicrometric technology); and precise definition of the active areas.

An example of the prior art LOCOS insulating technique will be described with reference to FIGS. 1–4, which show the formation of an N and P type transistor and EPROM memory cell of an N-well CMOS device.

FIG. 1 shows an intermediate structure produced by forming an N-well 2 in a P type substrate 1; growing an oxide layer 3 ("pad oxide") on the substrate 1; depositing a layer of nitride 4 on pad oxide 3; and simultaneously defining N and P type active areas by masking and subsequently etching the nitride layer 4. The FIG. 1 structure, therefore, comprises a substrate 1 housing an N-well 2 and selectively covered (in the portions defining the active areas of the finished integrated circuit) with an oxide layer 3, a nitride layer 4, and a photoresist masking layer 5.

At this point, a second masking operation, shown in FIG. 2, is performed for protecting the N type regions prior to implanting the channel stoppers, and which operation includes covering the N-well region with a resist mask 6 (FIG. 2), followed by performing a high-energy boron implantation as shown by arrows 7.

Implantation and diffusion of boron ions inside the substrate 1 results in the formation of P+ type channel stoppers 8 inside the unmasked portions of the substrate, at which point, resist layers 5 and 6 are removed, and, via field oxidation, field oxide regions 10 are formed, with intrusion of the oxide beneath the nitride layer 4 along the edge of the active areas (thus forming the so-called "field beak"), as shown in FIG. 3.

In the example described and shown, the process continues, as shown in FIG. 4, by removing nitride layer 4; growing a gate oxide layer 13; depositing and doping (via phosphorus or $POCl_3$ implantation) a first polysilicon layer 14; defining the first polysilicon layer 14 in the memory matrix region and the parts of the circuit featuring UPROM (Unerasable Programmable Read Only Memory) cells which require the first polysilicon layer 14 for forming floating gates; growing and removing an intermediate oxide layer 15 in the cell-free circuit regions; and depositing a second polysilicon layer 16 using the known Double Short Circuited Polysilicon technique whereby the second polysilicon layer 16 contacts the first polysilicon layer 14 in the cell-free circuit regions, and is separated from the first polysilicon layer 14 in the cell regions by the intermediate oxide layer 15.

The above phases result in the formation of the intermediate structure shown in FIG. 4, which structure includes presents substrate 1; well 2; field oxide regions 10; channel stoppers 8; gate oxide layer 13; first polysilicon layer 14; intermediate oxide layer 15; and second polysilicon layer 16. For the sake of simplicity, layers 14 and 16 in FIG. 4 are also illustrated separately in the circuit region (to the left of the structure) the two layers would merge to form the transistor gates.

In the prior art LOCOS technique described and shown, high-energy implantation (as shown by arrows 7 in FIG. 2) provides for raising the turn-on threshold voltage of the parasitic transistors formed by the interconnecting lines over the field oxide regions, and which, in the event of an overly thin field oxide region or insufficient doping of the substrate, may result in inversion of the conductivity of the silicon region underlying the field oxide region, thus reducing or even jeopardizing the electric performance of the finished integrated circuit. As the threshold voltage of the parasitic transistors, however, increases in proportion to doping ion concentration, the above phenomenon is prevented by increasing the doping concentration at the silicon-field-oxide interface, so that the threshold voltage of the parasitic transistors is greater than the maximum operating voltage of the integrated circuit. For this purpose, ions of the same type as the substrate (in this case, boron) are high-energy implanted for ensuring correct isolation and preventing segregation of the doping agent in the oxide during field oxidation.

Whereas the threshold voltage of the parasitic transistors increases, the breakdown voltage of the junction formed between the channel stopper and the active areas decreases alongside an increase in doping ion concentration. Moreover, the presence of the junction also creates a parasitic capacitance, due to the depletion region, which is directly proportional to channel stopper concentration close to the active areas. Such conflicting requirements, therefore, involve a tradeoff, which generally results in selecting the implant dose of the channel stopper so that the threshold voltage of the parasitic transistor and the breakdown voltage of the junction exceed the maximum voltage of any one part of the device.

As already stated, in the prior art LOCOS technique, formation of the channel stoppers beneath the field oxide regions requires an additional masking stage for preventing the N-well regions from also being doped.

Though widely used, the LOCOS technique can be improved with respect to the number of masking stages involved, which substantially affect both manufacturing and finished circuit cost, as well as with respect to the electric characteristics of the device in terms of the threshold voltage of the parasitic transistor.

Accordingly, it is an object of the present invention to provide an improved manufacturing process which reduces the number of masking stages involved in forming the channel stoppers, without jeopardizing, and while at the same time improving, the electric characteristics of the finished device.

SUMMARY OF THE INVENTION

According to the present invention, there is provided a process for manufacturing MOS integrated circuits, which includes the following steps: 1. selectively growing field insulating regions of insulating material extending partly inside a substrate; 2. depositing a polycrystalline silicon layer on the substrate; shaping the polycrystalline silicon layer through a mask; and 3. implanting ions of the same conductivity type of the substrate, using the shaping mask, through the field insulating regions and into the substrate for forming channel stopper regions.

BRIEF DESCRIPTION OF THE DRAWINGS

A preferred, non-limiting embodiment of the present invention will be described by way of example with reference to the accompanying drawings, in which.

DETAILED DESCRIPTION

In the following description, reference is made solely to FIGS. 5 to 11, the elements of which, similar to those of FIGS. 1 to 4, are referred to using the same numbering system.

Figure 1:
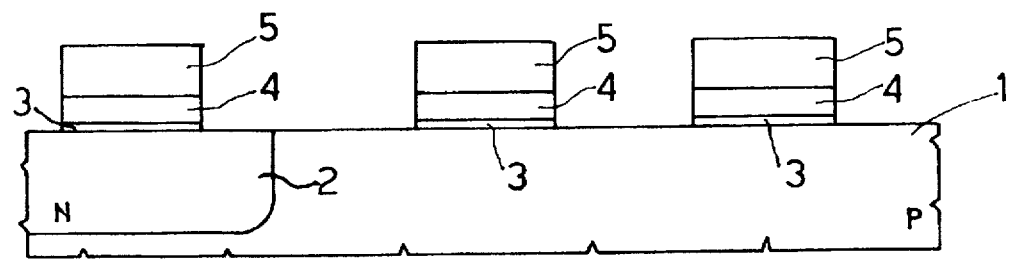
FIGS. 1 to 4 show cross-sections of a silicon wafer at four different stages of the prior art LOCOS process, for forming two complementary transistors and a memory cell.
Figure 2:
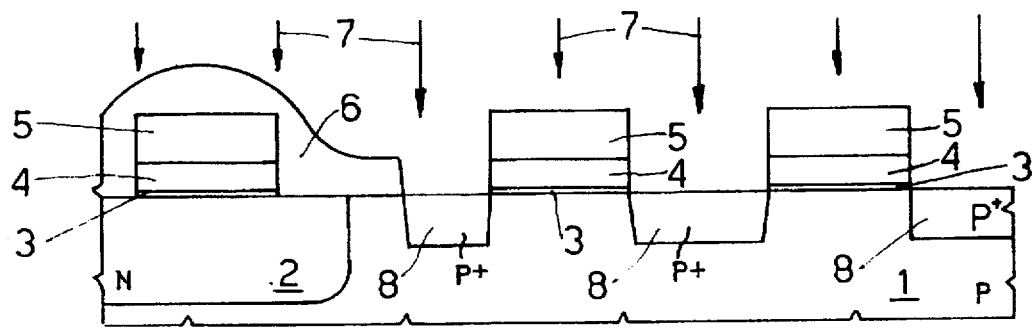
Figure 3:
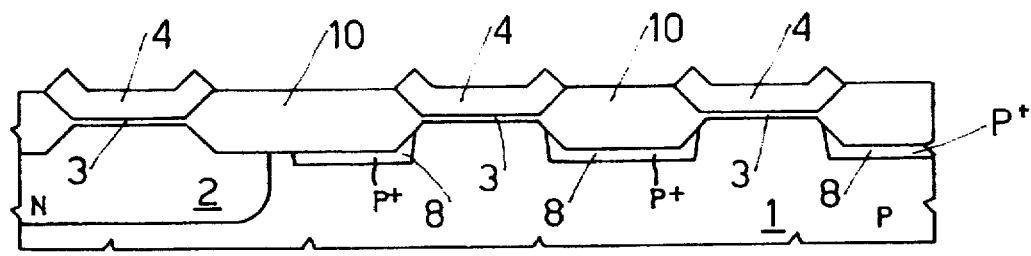
Figure 4:
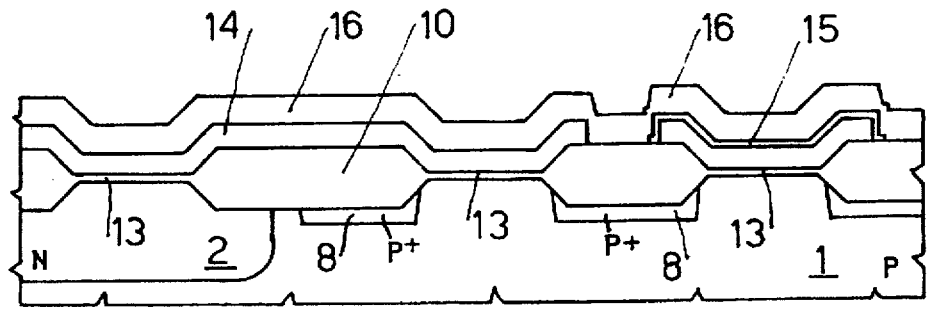
Figure 5:
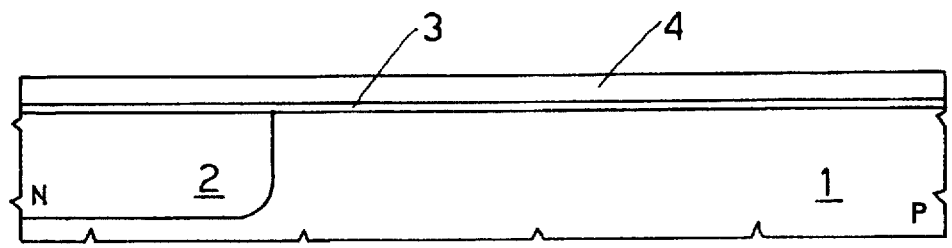
FIGS. 5 to 11 show cross-sections of a silicon wafer at different stages in the formation of two complementary transistors and a memory cell according to the present invention.
Figure 6:
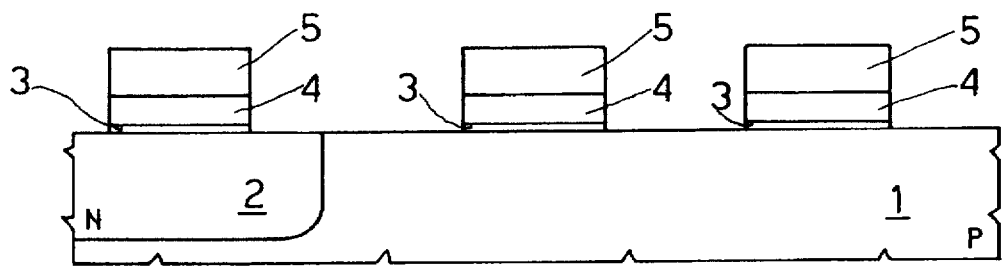

FIG. 5 shows a cross-section of a silicon wafer consisting of a substrate 1 housing an N-well 2 and upon which substrate 1 lies a silicon oxide layer 3 and a nitride layer 4. The FIG. 5 structure is masked using known photolithographic techniques, for obtaining a mask on the active areas including photoresist portions 5 extending over the required field oxide regions, and, thereafter, the exposed portions of the nitride layer 4 and oxide layer 3 are removed to produce the FIG. 6 structure which is identical to that of FIG. 1.

Figure 7:
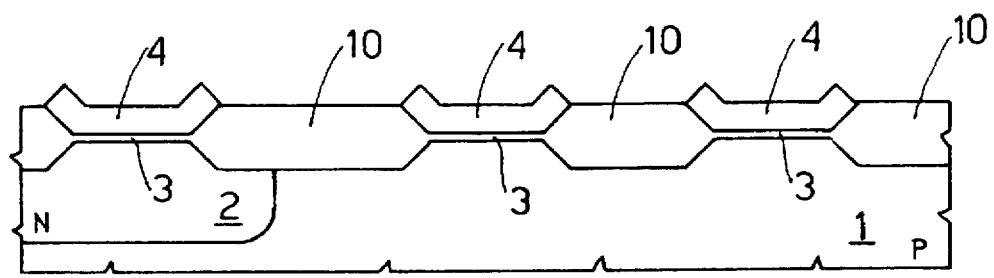
Figure 8:
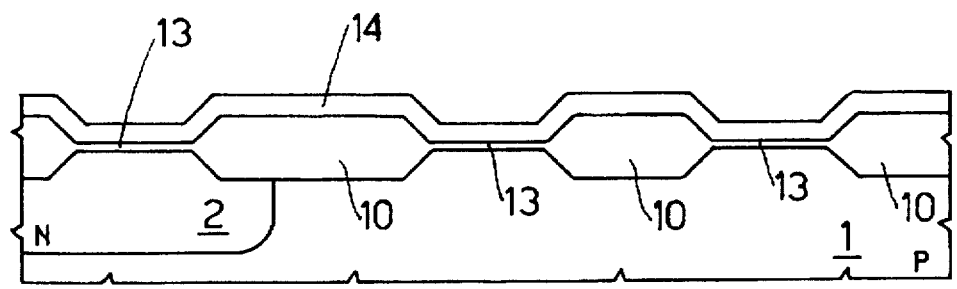

Unlike the prior art LOCOS process described above, immediately following removal of the photoresist layer 5, thick-oxide field insulating regions 10 are grown, with the nitride layers 4 being slightly distorted by intrusion (in known manner) of the oxide along the edge of the active areas, to produce the structure shown in FIG. 7.

At this point, nitride layer 4 and oxide layer 3 are removed, a gate oxide layer 13 is grown, and a first polysilicon layer 14 is deposited on the oxide layer 13. The first polysilicon layer 14 is subsequently doped by implanting phosphorus or POCl$_3$ conventionally, to produce the FIG. 8 structure wherein gate oxide layer 13, which merges with the oxide 10 in the field insulating regions, is shown solely in the active areas.

Figure 9:
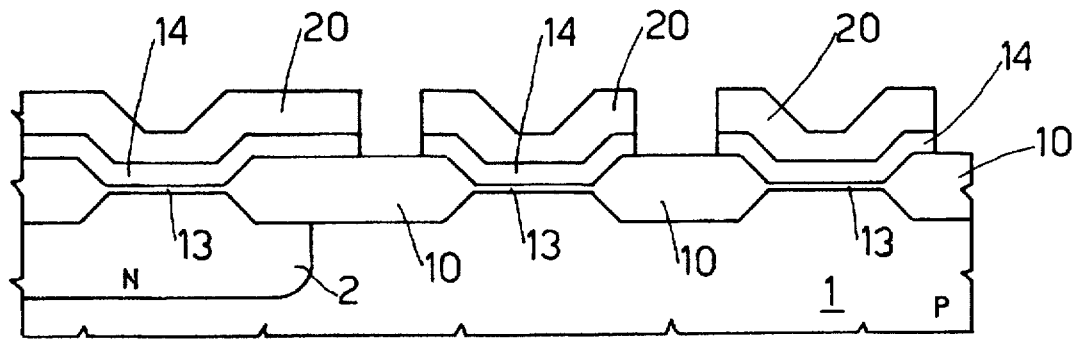

First polysilicon layer 14 is then defined through a masking and chemical etching operation, to produce the FIG. 9 structure. As shown, the photoresist mask 20, used for defining layer 14, differs from that of the prior art LOCOS technique in that, in addition to exposing the portions of layer 14 surrounding the memory cell region (to the right) and the UPROM cell region (not shown), it also exposes layer 14 over the field insulating regions 10 formed in the P type substrate, i.e. the regions in which the channel stoppers are to be formed.

Figure 10:
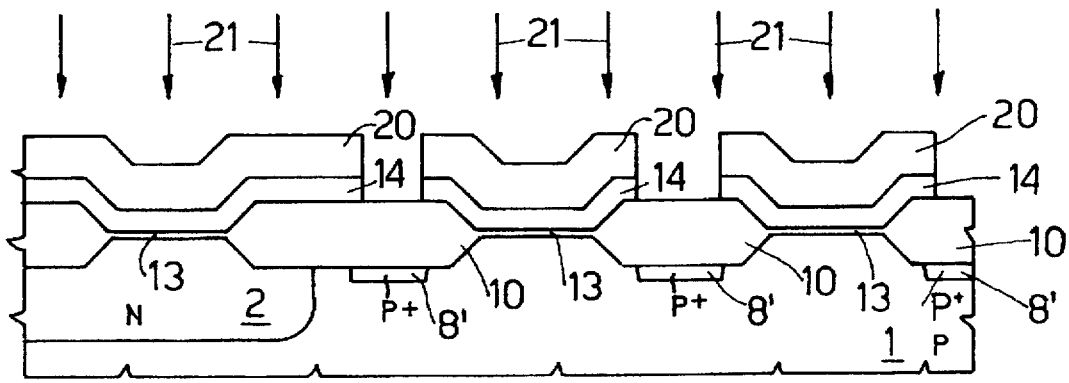
Figure 11:
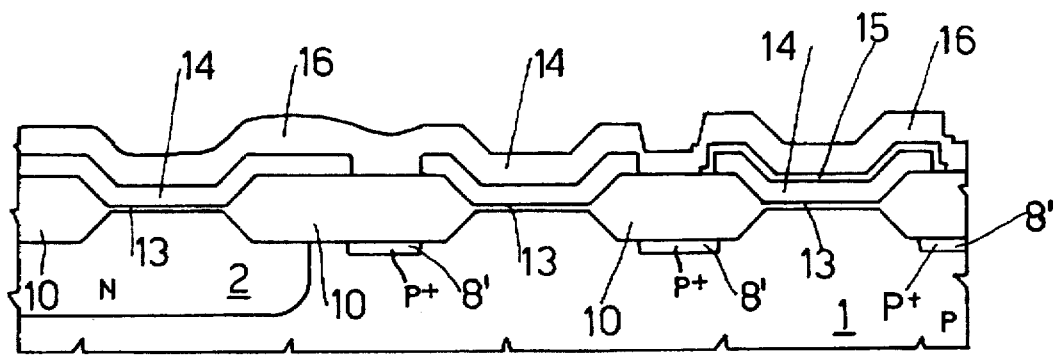

Subsequently, after removing the exposed portions of the polysilicon layer 14, boron ions are implanted as shown by arrows 21 in FIG. 10. This is performed in a high-energy manner, to penetrate the full thickness of field oxide layer 10 (typically 5000–7000 A), and results in the formation of small boron ion layers 8' underlying field insulating regions 10 and P+ type channel stoppers after diffusion.

Following implantation of layers 8', photoresist mask 20, used for defining first polysilicon layer 14 and implanting channel stoppers 8' is removed. An oxide layer 15 is thereafter grown for insulating the polysilicon layers. Oxide layer 15 is then removed selectively, with masking the circuit component portions. The oxide layer 15 is in fact removed from the circuit component portions (on the left side of FIG. 11) and remains only in the array zone (on the right side). A second polysilicon layer 16 is then deposited, to produce the structure shown in FIG. 11.

The next stages in the process consist in forming the various components in and on the substrate, according to the particular circuit and technique in question, and more specifically, in doping second polysilicon layer 16, defining the transistor gates, implanting the transistor source and drain regions, and finally, protecting and interconnecting the devices.

In other words, in the process according to the present invention, first polysilicon layer 14 and the photoresist mask 20, employed for defining the first polysilicon layer 14, protect the active areas and N-well regions at the channel stopper implantation stage, thus eliminating the need for an additional mask and so reducing the total number of masking stages for producing the circuit.

The advantages of the process according to the present invention will be clear to those skilled in the art from the foregoing description. In particular, besides eliminating one masking stage, as described above, and so reducing production time and cost, the process according to the present invention also provides for improved electric performance by enabling implantation of the channel stoppers at a slightly greater distance from the active areas as compared with the prior art LOCOS technique wherein the stoppers are self-aligned. Moreover, the doping ions implanted subsequent to field oxidation are not involved in the field oxidation necessary to form the gate oxide layer 13 and, by virtue of not being subjected to the relative heat processes, diffuse to a lesser degree. This result further reduces the doping ion concentration close to the active areas and, consequently, increases the breakdown voltage and reduces the parasitic capacitance, with no reduction in the turn-on threshold of the parasitic transistors.

To those skilled in the art it will be clear that changes may be made to the process as described and illustrated herein without, however, departing from the scope of the present invention. In particular, though specific reference is made herein to the formation of CMOS devices featuring two polysilicon layers (e.g. EPROM memories), the process described may be modified to also or alternatively produce single-polysilicon-layer devices (such as ROM memories), or NMOS or PMOS-type devices.

The foregoing description is intended to be exemplary and in no way limiting. The scope of the invention is defined in the appended claims and equivalents thereto.

What is claimed is:

1. A MOS-type integrated circuit comprising:

a substrate of semiconductive material;

at least two devices formed on the semiconductive material;

a plurality of field insulating regions of insulating material separating the devices and extending partly within the substrate;

a first layer of polycrystalline semiconductive material on the field insulating regions;

a second layer of polycrystalline semiconductive material on the first layer of polycrystalline semiconductive material;

an insulating layer between the first and second polycrystalline layers only in an area of one of the two devices; and channel stopper regions including ions within the substrate beneath at least one field insulating region and beneath only openings within the first layer of polycrystalline semiconductive material, wherein the channel stopper regions and the openings are formed by a common mask such that the channel stopper regions and openings are self-aligned.

2. An integrated circuit as claimed in claim 1 wherein the substrate and the ions are of a selected conductivity type.

3. An integrated circuit as claimed in claim 2 wherein the selected conductivity type is P type.

4. An integrated circuit as claimed in claim 3 wherein the ions include Boron.

* * * * *

UNITED STATES PATENT AND TRADEMARK OFFICE

CERTIFICATE OF CORRECTION

PATENT NO. : 5,696,399
DATED : December 9, 1997
INVENTOR(S): Manlio Cereda, Giancarlo Ginami, Enrico Laurin and Andrea Ravaglia It is certified that error appears in the above-identified patent and that said Letters Patent is hereby corrected as shown below:

On the title page, item:

[75]    Inventors: Manlio S. Cereda Lomagna, Giancarlo Ginami, Bergamo,
                   Enrico Laurin, Monza, and Andrea Ravaglia, Vercurago,
                   all of Italy Signed and Sealed this Tenth Day of February, 1998

Attest:

BRUCE LEHMAN

Attesting Officer          Commissioner of Patents and Trademarks